(12) United States Patent
Patti et al.

(10) Patent No.: US 9,145,294 B2
(45) Date of Patent: Sep. 29, 2015

(54) ELECTRONIC DEVICE COMPRISING A NANOTUBE-BASED INTERFACE CONNECTION LAYER, AND MANUFACTURING METHOD THEREOF

(75) Inventors: Davide Giuseppe Patti, Mascalucia (IT); Alessandro Mascali, Syracuse (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 105 days.

(21) Appl. No.: 13/170,908

(22) Filed: Jun. 28, 2011

(65) Prior Publication Data

US 2011/0316173 A1    Dec. 29, 2011

(30) Foreign Application Priority Data

Jun. 29, 2010   (IT) .................. TO10A0555

(51) Int. Cl.
*H01L 21/44* (2006.01)
*B82Y 10/00* (2011.01)
(Continued)

(52) U.S. Cl.
CPC ............... *B82Y 10/00* (2013.01); *B82Y 30/00* (2013.01); *F28D 11/00* (2013.01); *F28F 21/02* (2013.01); *H01L 23/36* (2013.01); *H01L 23/373* (2013.01); *H01L 23/48* (2013.01); *H01L 23/49513* (2013.01); *H01L 24/13* (2013.01); *H01L 24/14* (2013.01); *H01L 24/16* (2013.01); *H01L 24/27* (2013.01); *H01L 24/29* (2013.01); *H01L 24/32* (2013.01); *H01L 24/81* (2013.01); *H01L 24/83* (2013.01); *F28F 2255/20* (2013.01); *H01L 24/45* (2013.01); *H01L 24/48* (2013.01); *H01L 2224/11* (2013.01); *H01L 2224/1319* (2013.01); *H01L 2224/13078* (2013.01); *H01L 2224/13193* (2013.01); *H01L 2224/1403* (2013.01); *H01L 2224/14505* (2013.01); *H01L 2224/16105* (2013.01); *H01L 2224/16145* (2013.01); *H01L 2224/29078* (2013.01);
(Continued)

(58) Field of Classification Search
CPC ................... H01L 2924/00; H01L 23/53276; H01L 21/76885; H01L 2221/1094
USPC ..................................... 257/753, 783, E51.04
See application file for complete search history.

(56) References Cited

U.S. PATENT DOCUMENTS 6,831,359 B2 * 12/2004 Heilbronner .................. 257/720
6,856,016 B2 *  2/2005 Searls et al. .................. 257/720
(Continued)

FOREIGN PATENT DOCUMENTS

DE        10125905 C1    11/2002
DE     102005016930 A1    9/2006

OTHER PUBLICATIONS

Italian Search Report and Written Opinion dated Mar. 10, 2010 from corresponding Italian Application No. TO201000555.
(Continued)

*Primary Examiner* — Jaehwan Oh
(74) *Attorney, Agent, or Firm* — Allen, Dyer, Doppelt, Milbrath & Gilchrist, P.A.

(57) ABSTRACT

An electronic device including a first region belonging to a semiconductor device having a first surface; a second region having a second surface; and an adhesion layer, set between the first and second regions, including first fibrils each having respective first and second ends. The first fibrils extend between the first and second surfaces and are fixed in a chemico-physical way to the first and second surfaces at the respective first and second ends.

11 Claims, 5 Drawing Sheets

(51) Int. Cl.
*B82Y 30/00* (2011.01)
*F28D 11/00* (2006.01)
*F28F 21/02* (2006.01)
*H01L 23/36* (2006.01)
*H01L 23/373* (2006.01)
*H01L 23/48* (2006.01)
*H01L 23/495* (2006.01)
*H01L 23/00* (2006.01)

(52) U.S. Cl.
CPC ............... *H01L 2224/29193* (2013.01); *H01L 2224/32245* (2013.01); *H01L 2224/45* (2013.01); *H01L 2224/48091* (2013.01); *H01L 2224/48227* (2013.01); *H01L 2224/48247* (2013.01); *H01L 2224/48472* (2013.01); *H01L 2224/73265* (2013.01); *H01L 2224/81191* (2013.01); *H01L 2224/81193* (2013.01); *H01L 2224/81345* (2013.01); *H01L 2224/81385* (2013.01); *H01L 2224/81897* (2013.01); *H01L 2224/838* (2013.01); *H01L 2224/83191* (2013.01); *H01L 2224/83193* (2013.01); *H01L 2224/83365* (2013.01); *H01L 2224/83385* (2013.01); *H01L 2924/00015* (2013.01); *H01L 2924/014* (2013.01); *H01L 2924/0105* (2013.01); *H01L 2924/01006* (2013.01); *H01L 2924/01013* (2013.01); *H01L 2924/01014* (2013.01); *H01L 2924/01023* (2013.01); *H01L 2924/01028* (2013.01); *H01L 2924/01029* (2013.01); *H01L 2924/0132* (2013.01); *H01L 2924/01033* (2013.01); *H01L 2924/01047* (2013.01); *H01L 2924/01079* (2013.01); *H01L 2924/01082* (2013.01); *H01L 2924/01094* (2013.01); *H01L 2924/0665* (2013.01); *H01L 2924/09701* (2013.01); *H01L 2924/15747* (2013.01)

(56) References Cited

U.S. PATENT DOCUMENTS

| | | | |
|---|---|---|---|
| 7,428,138 B2 * | 9/2008 | Mosley et al. | 361/508 |
| 7,719,039 B2 * | 5/2010 | Muralidhar et al. | 257/248 |
| 8,194,407 B2 * | 6/2012 | Yamaguchi et al. | 361/708 |
| 8,598,569 B2 * | 12/2013 | Afzali-Ardakani et al. | 257/40 |
| 2003/0035276 A1 * | 2/2003 | Hedler et al. | 361/764 |
| 2004/0005736 A1 * | 1/2004 | Searls et al. | 438/122 |
| 2005/0145367 A1 * | 7/2005 | Hannah et al. | 165/80.3 |
| 2007/0230133 A1 * | 10/2007 | Michel et al. | 361/708 |
| 2007/0267735 A1 * | 11/2007 | Awano et al. | 257/692 |
| 2008/0169563 A1 * | 7/2008 | Awano et al. | 257/746 |
| 2008/0191944 A1 * | 8/2008 | Brod | 343/700 MS |
| 2009/0011232 A1 * | 1/2009 | Dai et al. | 428/355 R |
| 2010/0018747 A1 * | 1/2010 | Wang et al. | 174/126.2 |
| 2013/0076371 A1 * | 3/2013 | Buschhorn | 324/538 |

OTHER PUBLICATIONS

Lee Cheng Choo et al., Factors Affecting the Growth of Carbon Nanotubes, Semiconductor Electronics, 2006, ICSE '06, IEEE International Conference on, IEEE, PI, Nov. 1, 2006, pp. 146-150, XP031113177.

* cited by examiner

ELECTRONIC DEVICE COMPRISING A NANOTUBE-BASED INTERFACE CONNECTION LAYER, AND MANUFACTURING METHOD THEREOF

CROSS REFERENCE TO RELATED APPLICATIONS

This application claims the priority benefit of Italian patent application number TO2010A000555, filed on Jun. 29, 2010, entitled ELECTRONIC DEVICE COMPRISING A NANOTUBE-BASED INTERFACE CONNECTION LAYER, AND MANUFACTURING METHOD THEREOF, which is hereby incorporated by reference to the maximum extent allowable by law.

BACKGROUND OF THE INVENTION

1. Field of the Invention

The present invention relates to an electronic device comprising an interface connection layer including a plurality of fibrils, and to a corresponding manufacturing method, and more particularly comprising an electrical and/or thermal interface connection layer including carbon nanotubes.

2. Discussion of the Related Art

Conventionally, methods for manufacturing semiconductor devices imply the production of a plurality of ideally identical semiconductor devices on a single wafer made of silicon or, in general, semiconductor material. Each semiconductor device is then separated from the other semiconductor devices by a cutting operation, which leads to the production of a plurality of dice, each die comprising one or more semiconductor devices. This operation is also known as "wafer dicing". Generally, each die is used in electrical and/or mechanical connection with a printed-circuit board (PCB) or with a substrate of a package. Said operation of connection is known as "die attach" or "level-one interconnect" (L1).

In the case where both a mechanical and an electrical connection is required, die attach is usually obtained by hot welding, for example using an alloy of metals such as Pb, Sn, Ag or by means of gluing, for example using a conductive resin. Other known solutions envisage the use of wire bonding or of flip-chip technology. In the case of wire bonding, each die is provided with one or more metal pads arranged on its own surface. The metal pads are electrically connected to respective metal pads of the printed-circuit board or of the substrate by means of conductive-wire connectors. Said wire connectors are usually made of gold, aluminum, or copper and have a diameter of some micrometers.

In the case of flip-chip technology, each die is provided with metal pads arranged on the surface of the die itself. Solder bumps are arranged on the metal pads of the die and are set in direct contact with the respective metal pads of the PCB or of the substrate with which it is desired to make the connection. Solder bumps are then melted, for example by means of an ultrasound process, so as to provide a mechanical and electrical connection between the PCB or the substrate and the die.

Said solutions, however, are not optimal, in so far as they require manufacturing steps that can introduce contaminating elements and can be very costly.

SUMMARY OF THE INVENTION

At least one embodiment provides an electronic device comprising an interface connection layer including a plurality of fibrils, and a respective manufacturing method that overcome at least some of the disadvantages of the known art.

At least one embodiment provides an electronic device comprising an interface connection layer including a plurality of fibrils, and a corresponding manufacturing method.

At least one embodiment provides an electronic device comprising a first region of a semiconductor device, having a first surface, a second region having a second surface, and an adhesion layer, arranged between the first and second regions, comprising first fibrils, each having respective first and second ends, said first fibrils extending between the first and second surfaces and being fixed in a chemico-physical way to the first and second surfaces at the respective first and second ends.

At least one embodiment provides a method for manufacturing an electronic device, comprising the steps of forming a first region of a semiconductor device, having a first surface, forming a second region having a second surface, forming first fibrils, each having respective first and second ends, extending between the first and second surfaces, thus forming an adhesion layer between the first and second regions, and fixing in a chemico-physical way said first fibrils to the first and second surfaces at the respective first and second ends, obtaining an adhesion between the first and second regions.

BRIEF DESCRIPTION OF THE DRAWINGS

For a better understanding of the present invention at least one embodiment is now described, purely by way of non-limiting example, with reference to the attached drawings, wherein.

DETAILED DESCRIPTION

Figure 1:
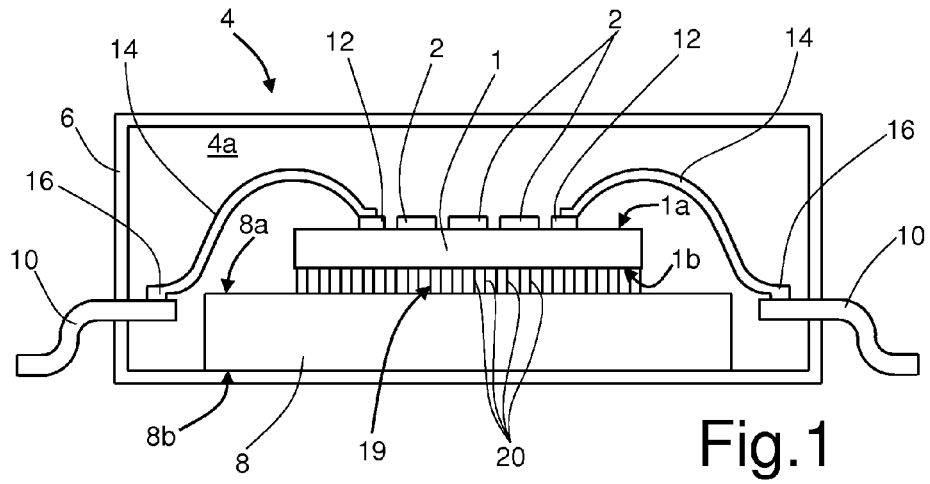
FIG. 1 shows a semiconductor die mechanically and thermally coupled to a conductive connection (leadframe) of a package by means of a plurality of fibrils, in particular carbon nanotubes.

FIG. 1 is a schematic cross-sectional view of a semiconductor die 1 arranged in a package 4 of a mixed metal and plastic type. The semiconductor die 1 has a first face 1a and a second face 1b and is configured to carry on the first face 1a one or more electronic devices 2, for example electronic power devices. The package 4 comprises a protective shell 6 configured to define an internal region 4a of the package, arranged in which is a conductive paddle 8, for example made of copper, having a first face 8a and a second face 8b. The conductive paddle 8 forms the central structure of the package 4 and has the function of thermal dissipator and/or of contact for electrical connections. The semiconductor die 1 is mounted within the protective shell 6 of the package 4 and is mechanically, electrically, and thermally coupled to the conductive paddle 8. Departing from the internal region 4a of the package 4 is a plurality of conductive connections 10, known as leadframes, which are configured to provide an electrical connection towards the outside of the protective shell 6 and are held in position by the protective shell 6. The semiconductor die 1 is moreover provided with a plurality of conductive pads 12 in electrical contact, via respective connection wires 14, with a respective conductive connection 10. Each connection wire 14 is in electrical contact with the semiconductor die 1 via the respective conductive pad 12, and with the conductive connection 10 via a respective welding spot 16.

As an alternative to the use of a package provided with protective shell 6, packages 4 are known in which the internal region 4a is filled by means of a resin, for example an epoxy resin, which itself forms a protective shell for the semiconductor die 1 and for the connection wires 14, and is designed to hold the conductive connections 10 in position.

The semiconductor die 1 is coupled to the conductive paddle 8 via an adhesive layer 19, formed by a plurality of fibrils, designated by the reference number 20, each fibril being provided with one end 20' coupled to the second face 1b of the semiconductor die 1, and one end 20" coupled to the first face 8a of the conductive paddle 8. Hence, each fibril 20 extends between the second face 1b of the semiconductor die 1 and the first face 8a of the conductive paddle 8.

The term "fibril" is understood in this context to be a thin fiber, for example in the form of a hollow or filled nanotube, with a diameter comprised between 1 nm and a few micrometers (for example, 5 µm), and a high aspect ratio (i.e., the ratio between the length and the diameter of the fibril), for example with a value of aspect ratio of between 1/1000, 5/1000. Preferably, said fibrils have a diameter of between 1 and 5 nm.

The fibrils interact with the face 1b or 8a towards which they extend by means of a plurality of interatomic forces or chemico-physical bonds, as is known in the literature. For example, the interactions can be due to covalent bonds, Van der Waals forces, electrostatic forces, or any combination thereof.

Hence, the fibrils 20 do not penetrate within the first face 1b and/or the second face 8a to which they are coupled, nor do they penetrate within possible further layers, not shown, that may be present on the first face 1b and/or the second face 8a, but just couple to the surface of the first face 1b and/or second face 8a or to the surface of said layers that may be present.

The aforementioned forces act between each fibril 20 and the respective face 1b and/or 8a with which the fibril 20 is set in contact, and between adjacent fibrils 20. In the case of a plurality of fibrils 20 formed separately both on the second face 1b of the semiconductor die 1 and on the first face 8a of the conductive paddle 8, the effect of mechanical coupling between the semiconductor die 1 and the conductive paddle 8 is consequently favored by the setting-up of forces acting between adjacent fibrils 20, which combine to form a comb-fingered structure.

The fibrils 20 may be of various types; for example, in the case where there is not required a coupling of an electrical or thermal type, but only a mechanical coupling, the fibrils 20 can be produced using soft-lithography techniques, employing a mold including a plurality of micromachined holes, in which a polymer, such as for example polydimethylsiloxane (PDMS), is poured and solidified. The softness and the reduced surface energy of PDMS enables a simple extraction of the cast from the mold by "peeling-off". The mold may be made of silicon or photoresist (for example, SU-8) by means of known lithography and etching techniques, or by means of the LIGA (Lithographic Galvanoformung Abformung) process, or obtained by punching a soft surface using the operative tip of an atomic-force microscope (AFM), or by means of laser ablation of a metal surface, or some other technique. In this way it is possible to obtain arrays of fibrils 20 having a precise spatial arrangement and highly controlled shapes and dimensions. It is possible to produce fibrils 20 having diameters ranging from a few nanometeres up to some micrometers, and lengths chosen as required. The mechanical stability of these fibrils 20 is limited by the material used. PDMS is relatively soft, and this limits the aspect ratio of the structures that can be obtained; however, this limitation can be overcome by using harder materials, such as, for example, polyurethane (PU) or polyurethane acrylate (PUA). As an alternative, it is possible to obtain fibrils 20 made of polymethyl methacrylate (PMMA) using, for example, a mold made of PDMS or PUA. PMMA enables structures to be obtained with a high aspect ratio (high value of the ratio between height and width of the structure obtained), and in particular fibrils 20 having a diameter starting from 80 nm and a much greater length, for example equal to 600 nm.

Alternatively, the fibrils 20 may be carbon nanotubes. In this case, the coupling provided by the nanotubes is both of a mechanical type (due to the chemico-physical interatomic forces that are set up between the surfaces of the nanotubes and the faces 1b and 8a) and of a thermal and electrical type (owing to the known properties of thermal and electrical conduction of carbon nanotubes). The carbon nanotubes are grown in a known way on the second face 1b of the semiconductor die 1 and/or on the first face 8a of the conductive paddle 8, for example by means of a process of temperature fragmentation of a deposited nickel layer.

Other methods of production or growth of carbon nanotubes are known in the literature, which is very extensive and rapidly expanding in this sector.

The adhesive layer 19 may comprise single-wall nanotubes (SWNTs) or multi-wall nanotubes (MWNTs), or both.

With reference to the example shown in FIG. 1, the adhesive layer 19 should possess, in addition to properties of mechanical coupling between the semiconductor die 1 and the conductive paddle 8, also a good thermal and/or electrical conductivity. In this specific application, carbon nanotubes find an application that is preferred over other types of fibrils previously described in so far as they are known for their excellent properties of electrical conduction (as regards carbon nanotubes with metallic behavior) and thermal conduction. In fact, carbon nanotubes having an armchair structure possess excellent properties of electrical conduction, with an estimated current density of the order of 1000 times that of copper, while the thermal conductivity is of the order of approximately 10 times that of copper and higher than the thermal conductivity of diamond.

Figure 2:
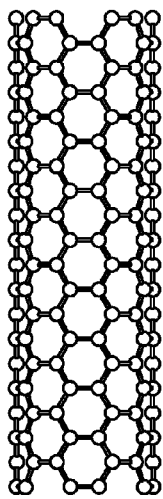
FIG. 2 shows a single-wall carbon nanotube with a chiral structure of a so-called armchair type.
Figure 3:
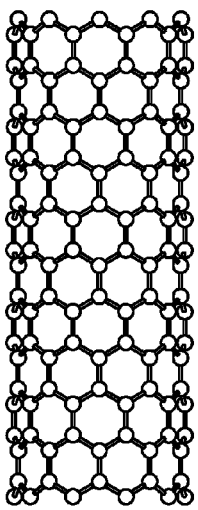
FIG. 3 shows a single-wall carbon nanotube with a chiral structure of a so-called zig-zag type.

FIGS. 2 and 3 show, by way of example, single-wall carbon nanotubes having different chirality (i.e., the way in which the carbon-carbon bonds succeed each other along the circumference of the tube), and in particular FIG. 2 shows a carbon nanotube with armchair structure, having a behavior of a metallic type, while FIG. 3 shows a nanotube with zig-zag structure, having a behavior of a semiconductor type.

Figure 4:
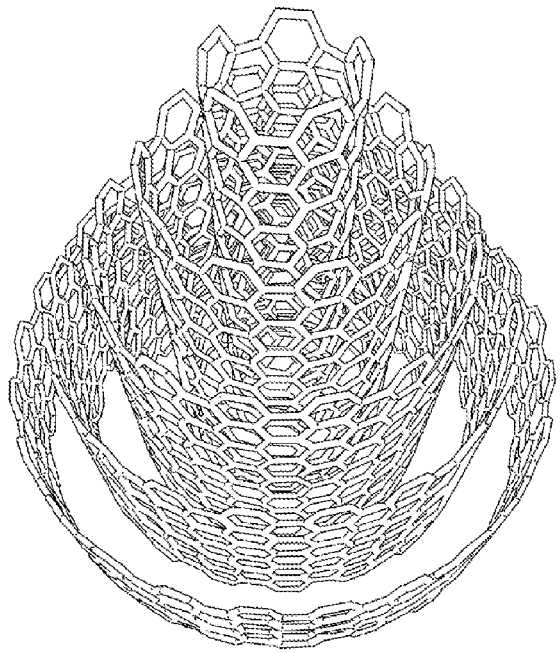
FIG. 4 shows a multiwall carbon nanotube.

FIG. 4 shows a multi-wall nanotube, which can be described as a plurality of single-wall carbon nanotubes having a different diameter, coaxial with respect to one another.

The adhesive layer 19 can indifferently comprise single-wall nanotubes or double-wall nanotubes, provided that they have a behavior of a metallic type and are good thermal conductors.

Figure 5A:
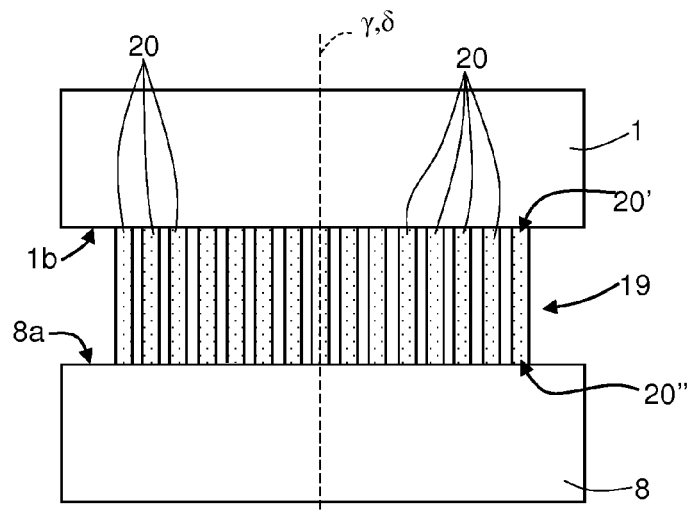
FIGS. 5a and 5b are schematic cross-sectional views of a semiconductor die coupled to a conductive substrate by means of an adhesion layer including a plurality of fibrils, in particular carbon nanotubes, according to different embodiments of the present invention.
Figure 5B:
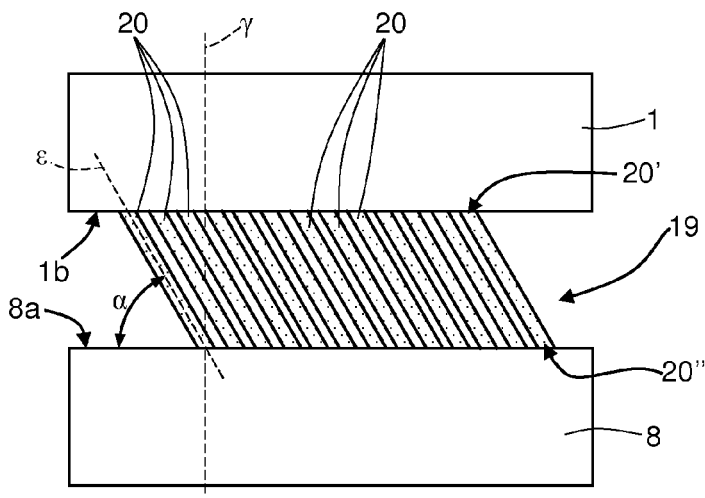

FIGS. 5a and 5b show two different configurations of a plurality of fibrils 20, for example single-wall and/or double-wall carbon nanotubes, arranged between the second face 1b of the semiconductor die 1 and the first face 8a of the conductive paddle 8.

In FIG. 5a the fibrils 20 extend from the second face 1b of the semiconductor die 1 and/or from the first face 8a of the conductive paddle 8 in a direction δ (or parallel thereto) substantially parallel to an axis γ orthogonal to the respective planes in which the semiconductor die 1 and the conductive paddle 8 lie; in FIG. 5b, the fibrils 20 extend from the second face 1b of the semiconductor die 1 and/or from the first face 8a of the conductive paddle 8 in a direction ε (or parallel thereto) inclined with respect to the axis γ by an angle of inclination α, for example of between 0 and 30°.

Figure 6:
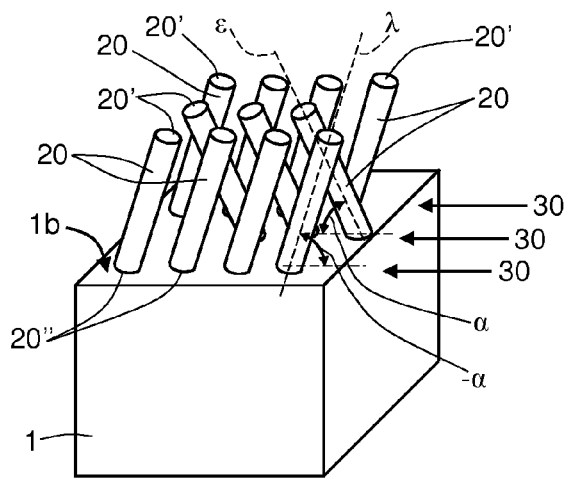
FIG. 6 shows by way of example a substrate including a plurality of fibrils, in particular carbon nanotubes, ordered in rows and extending in different spatial directions.

FIG. 6 shows, in perspective view and according to a further embodiment, a plurality of fibrils 20, for example single-wall and/or double-wall carbon nanotubes, arranged on the second face 1b of the semiconductor die 1, and/or, likewise, in a way not shown in the figure, on the first face 8a of the conductive paddle 8. According to the embodiment of FIG. 6, the fibrils 20 extend along alternating rows 30. The fibrils 20 extend, in alternating rows 30, in a respective direction ε and λ, inclined, respectively, by an angle α or −α with respect to the axis γ, orthogonal to the plane in which the semiconductor die 1 (or, likewise, the conductive paddle 8) lies. Hence, all the fibrils 20 (except for possible manufacturing defects) belonging to one and the same row 30 are inclined by one and the same angle±α with respect to the axis γ. It is evident that there can be envisaged tolerance bands of the angles±α of the direction of extension of each fibril 20, for example envisaging a tolerance range of α±30% and, respectively, −α±30%.

Figure 7:
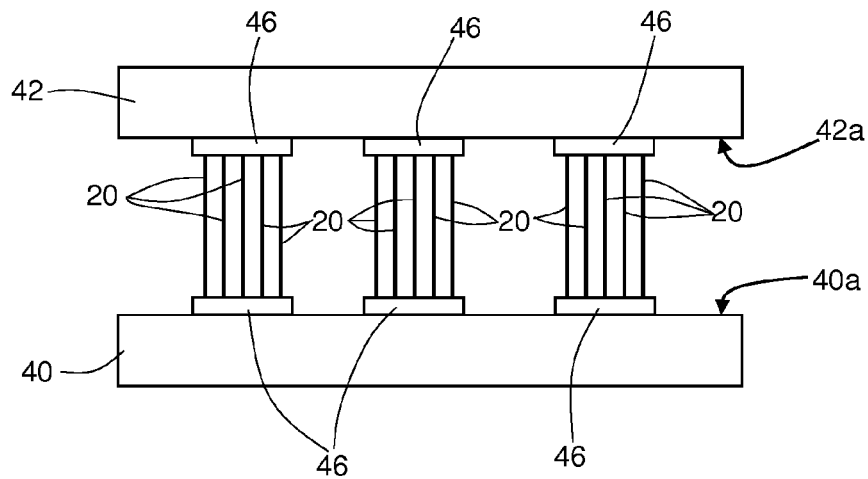
FIG. 7 is a schematic cross-sectional view of two chips electrically coupled via a plurality of conductive fibrils, in particular carbon nanotubes.

FIG. 7 is a schematic cross-sectional view, according to a further embodiment of the present invention, of a first chip 40 and a second chip 42 having respective coupling surfaces 40a and 42a mechanically and electrically coupled to one another by means of a plurality of fibrils 20 (the dimensions of the various elements of the figure are not in the same scale of representation for reasons of clarity of illustration).

The fibrils 20 are, for example, carbon nanotubes grown on one or both of the coupling surfaces 40a, 42a. To guarantee the electrical coupling, the fibrils 20 are selectively formed on the coupling surface 40a or 42a of the chip 40 or 42 in points corresponding to, or generically in electrical contact with, respective electrical-contact areas 46 (for example, pads or conduction terminals of electronic devices such as transistors) present on said coupling surfaces 40a, 42a. Said fibrils 20 have hence both a function of mechanical coupling between the two chips 40 and 42 and of electrical coupling.

Figure 8:
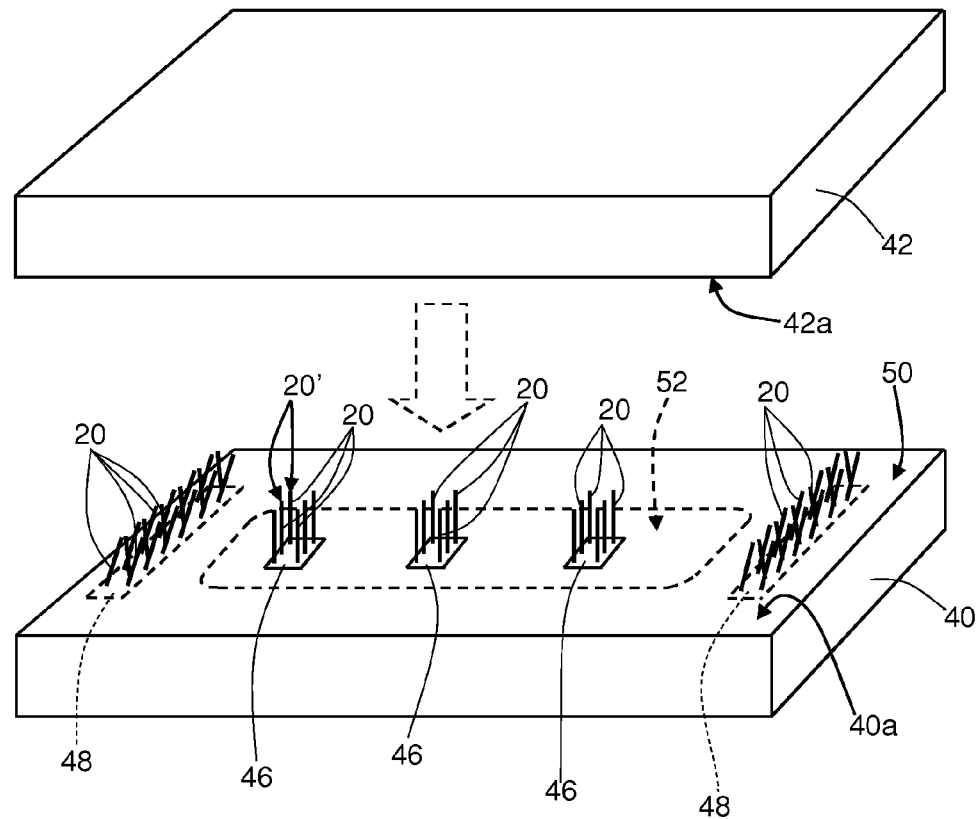
FIG. 8 shows a first chip comprising an active-area region including a first plurality of fibrils designed to set up an electrical connection with a second chip, and a peripheral connection, surrounding the active-area region, including a second plurality of fibrils designed to set up a mechanical connection with the second chip.
Figure 9:
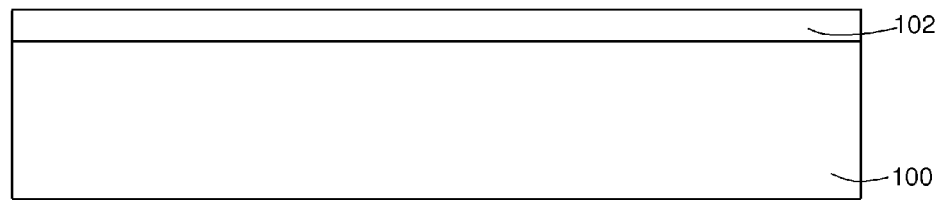
FIGS. 9-14 show manufacturing steps of a device comprising a mechanical, electrical, and thermal interface connection layer including a plurality of fibrils.
Figure 10:
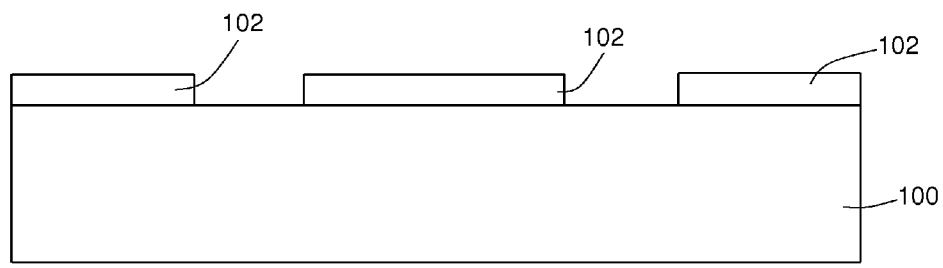
Figure 11:
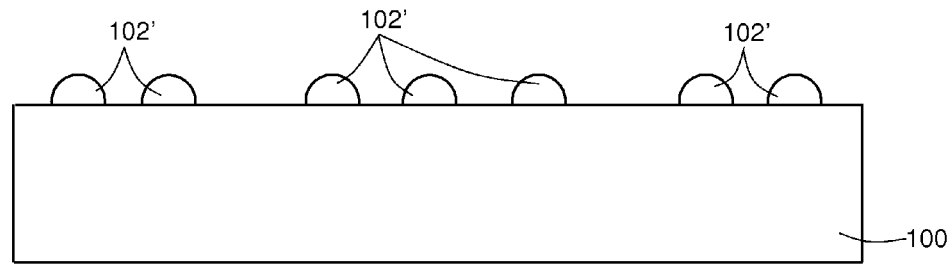
Figure 12:
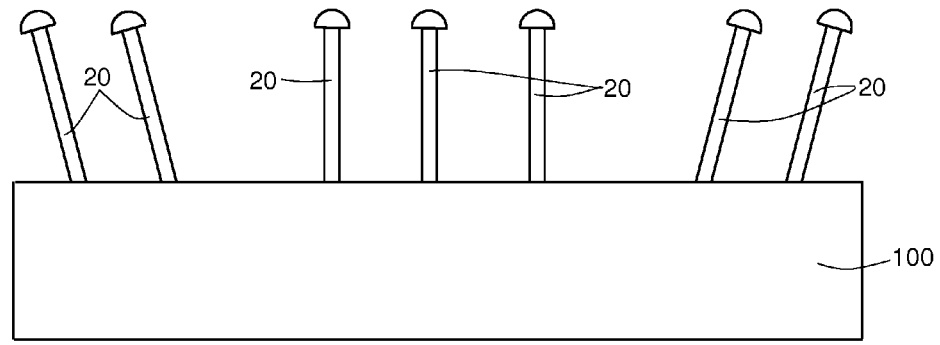

As shown in FIG. 8 with reference to the chip 40 (but what is described likewise applies to the chip 42), in order to improve the mechanical coupling it is possible to form a plurality of fibrils 20 in mechanical-contact areas 48, located a peripheral area 50 external to the active area 52 of the chip 40. Said fibrils 20 formed in the peripheral area 50 principally have a function of mechanical coupling, rendered possible by the chemico-physical interactions at an interatomic level that occur between the contact surface of each fibril 20 formed on the face 40a of the chip 40 and the coupling surface, for example the surface 42a of the chip 42. In the second place, the fibrils 20 in the peripheral area 50 may (but not necessarily do) have a function of electrical and/or thermal coupling between the chips 40 and 42. The fibrils 20 formed in the peripheral area 50 can hence be of a conductive type (for example, carbon nanotubes) or non-conductive type (for example made of polymeric material, PDMS, PMMA, etc.).

Within the active area 52 are, instead, arranged a plurality of fibrils 20 which extend from the coupling surface 40a of the chip 40 starting from, or in electrical contact with, electrical-contact areas 46 (as has been said, pads or conduction terminals of electronic devices provided on the chip 40). These fibrils 20, for example carbon nanotubes, adapted to conduct electric current, have principally a function of electrical connection between the chip 40 and the chip 42 and, secondarily, improve the mechanical connection between the chips 40 and 42 provided by the fibrils 20 formed in the peripheral area 50. Also in this case, the mechanical connection is provided by the interactions at an interatomic level between the end 20' of each fibril 20 with the area of contact of the coupling surface 42a of the chip 42 with which said fibrils 20 are in contact.

It is evident that, in the case where the electrical connections formed within the active area 52 are in an amount sufficient to guarantee a good mechanical tightness between the chips 40 and 42, the fibrils 20 grown in the peripheral area 50 are not necessary, and fibrils 20 are present only in the active area 52.

Instead, if no electrical connection of the active area 52 is required, the fibrils 20 grown in the active area 52 are not necessary, and fibrils 20 are present only in the peripheral area 50.

A method of synthesis of carbon nanotubes compatible with integrated-circuit technology envisages the use of the CVD (chemical vapor deposition) technique. The growth of carbon nanotubes using the CVD technique presents the advantage of not introducing contaminating elements, enabling the growth of nanotubes of high purity and good crystallinity, and enabling a high level of control of the length of the nanotubes during the process of growth. Numerous strategies, of a known type, may be adopted for controlling the morphology (number of layers, diameter, geometrical shape, length, heterostructure, etc.), density, alignment, and orientation of growth of carbon nanotubes by means of the CVD technique.

With reference to FIGS. 9-12, there is described a process for the growth of fibrils 20, in particular carbon nanotubes, on a surface of a substrate 100. Said substrate 100, with reference to the preceding figures, may belong indifferently to one or both of the chips 40, 42 and/or to the semiconductor die 1 and/or to the conductive paddle 8.

The substrate 100 can be at an advanced machining stage, for example at the end of photolithographic and etching processes for the production of electronic devices. To enable growth of carbon nanotubes on said substrate 100 (FIG. 9) a catalyst layer 102, for example made of nickel, is deposited. The catalyst layer 102 can, more generally, be made of a material such as to serve as seed for the subsequent orderly growth of carbon nanotubes, for example an alloy containing nickel. The layer 102 has a thickness of between 2 nm and 10 nm and is, for example, deposited with the PECVD technique.

Then (FIG. 10), the catalyst layer is subjected to subsequent steps of lithography and etching to define the regions in which it is desired to form the carbon nanotubes. In greater detail, the catalyst layer 102 is removed from the surface of the substrate 100 except for the regions in which it is desired to form the carbon nanotubes. Said regions (see FIG. 8) are the electrical-contact areas 46 within the active area 52 and the mechanical-contact areas 48 within the peripheral area 50.

To define a particular geometry of growth of the carbon nanotubes in regions corresponding to the electrical-contact areas 46 and mechanical-contact areas 48, for example to define rows 30 of the type shown in FIG. 6, the catalyst layer 102 is patterned, by means of known steps of lithography and etching, also in the electrical-contact areas 46 and mechanical-contact areas 48, for example by defining rows of the catalyst layer 102 (not shown) corresponding to the rows 30 of FIG. 6.

Next (FIG. 11), by means of a high-temperature process, for example with a temperature of between 600° C. and 800° C., the catalyst layer 102 is fragmented to define a plurality of islands 102'. Said islands 102' generally have a spherical or hemispherical shape, with a diameter comprised between 1 and 10 nm.

Using an appropriate reactor, a plurality of carbon nanotubes 20 is grown. The growth can occur via CVD (chemical vapor deposition) or with electric arc, and the time of growth is chosen in such a way as to obtain a desired length of the carbon nanotubes 20, for example comprised between 1 μm and 5 μm, preferably equal to 2 μm.

By appropriately punching the layer underlying the catalyst 102, depressions are formed having, for example, a V-shape in a cross-sectional view. In such a situation, as is known in the literature, the starting surface on which the carbon nanotube grows is inclined according to the wall of the depression. It is thus possible to define a preferential direction of growth of the carbon nanotubes 20.

According to one embodiment, the process of growth is the following: by applying to the catalyst layer 102, made of nickel, a high temperature, for example between 600° C. and 800° C., the catalyst layer 102 liquefies without sublimating and forms nickel droplets, the radius of curvature of which depends upon the thickness, here comprised between 2 and 10 nm, and upon the force of gravity. The nickel droplets function as catalyst for the reaction of formation of the carbon nanotubes 20. In the absence of defects of the substrate 100, the carbon nanotubes 20 can grow (FIG. 12) according to the desired direction, defined during the punching step, while the nickel droplets remain on the top of the carbon nanotubes 20.

Tubular structures are thus formed, each of which is mushroom-shaped, the head of which is the nickel droplet. Once the growth of the carbon nanotubes 20 is completed, the nickel can be removed by washing or in other appropriate ways (not shown).

Figure 13:
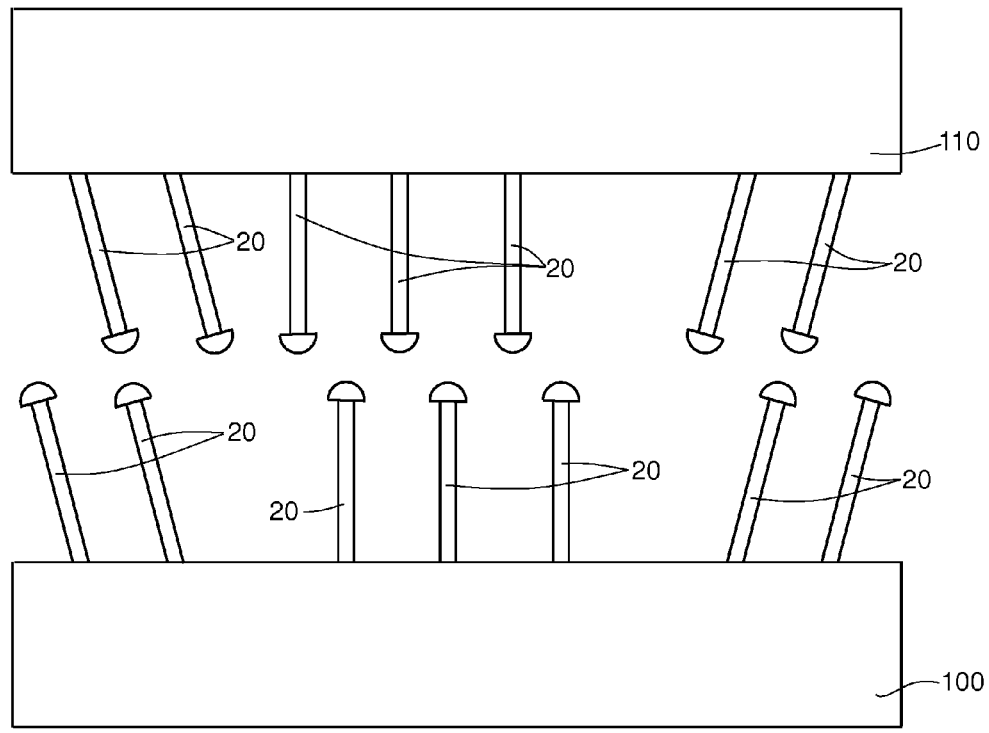

According to an embodiment, as shown in FIG. 13, the carbon nanotubes 20 are formed according to the process described with reference to FIGS. 9-12 also on the surface of a further substrate 110 (for example, a substrate of a die, or chip, or, as an alternative to the substrate 110, a conductive substrate belonging to a package) to which the substrate 100 should be mechanically coupled. More in particular, the carbon nanotubes 20 formed both on the substrate 100 and on the substrate 110 extend from the respective substrate in various spatial directions, for example as shown in FIG. 6 and described with reference to said figure. By coupling the substrate 100 and 110 in such a way that the respective areas that present the carbon nanotubes correspond to one another, it is possible to provide a mechanical coupling whereby the carbon nanotubes 20 belonging to the two substrates 100 and 110 couple so as to form a comb-fingered structure.

The mechanical coupling thus obtained is minimally affected by the stresses of expansion due to a variation in temperature during the use of said dice or chips or packages.

Furthermore, it is possible to grow carbon nanotubes with different spatial orientation according to the function for which they are intended. For example, the carbon nanotubes grown for purposes of electrical coupling are preferably grown in a direction substantially orthogonal to the respective substrates, while the carbon nanotubes grown on one and the same substrate but for purposes of mechanical coupling are preferably grown at a certain angle with respect to the axis normal to the substrate (as described previously).

At the end of the growth of the carbon nanotubes on both of the substrates 100 and 110

Figure 14:
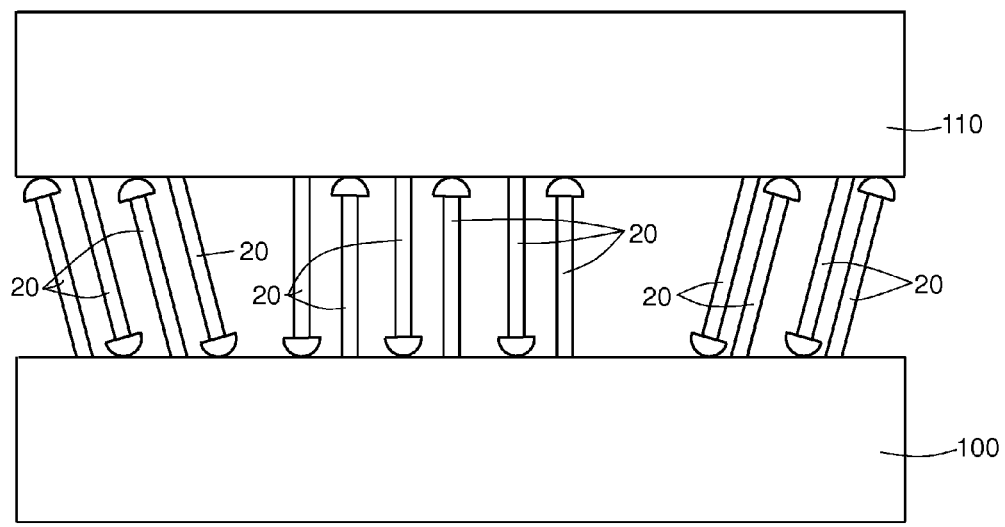

(FIG. 14), said substrates 100 and 110 are aligned with respect to one another and the nanotubes of a substrate are set in contact with the surface of the other substrate to provide the desired electrical and/or mechanical coupling. The step of alignment and approach can be carried out by means of known equipment for assembly of microelectronic devices, by appropriately defining the parameters of force applied during the steps of approach in order not to damage the plurality of nanotubes.

From an examination of the characteristics of the invention provided according to the present disclosure the advantages that it affords are evident.

In the first place, with reference to FIG. 1, it is not necessary to use contaminating adhesive resins for the coupling between a die and a package.

In addition, the die-attach process is a cold process that does not cause thermal stresses on the die or on the components provided thereon.

Furthermore, the use of carbon nanotubes, known for their excellent properties of electrical and thermal conduction, as well as for their properties of mechanical strength, guarantees an optimization of the coupling, both electrical and mechanical, between dice or chips of a different type, or between a die and a package.

Finally, it is clear that modifications and variations may be made to the embodiments described and illustrated herein, without thereby departing from the sphere of protection thereof, as defined in the annexed claims.

For instance, it is possible to grow the carbon nanotubes or to form generic fibrils, according to any of the techniques known in the literature.

Furthermore, in addition or as an alternative to carbon nanotubes, it is possible to use fibrils 20 of another type, for example made of polymeric material for guaranteeing a mechanical connection between chips or dice or between a die and the conductive paddle of a package, and use, instead, carbon-nanotube fibrils 20 to form the electrical connections between said chips or dice or between a die and the conductive paddle of the package.

Having thus described at least one illustrative embodiment of the invention, various alterations, modifications, and improvements will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An electronic device comprising:
an integrated circuit (IC) having opposing first and second surfaces;
a semiconductor device having an active region and mechanical contact regions laterally spaced therefrom and positioned at a periphery of said semiconductor device;
a plurality of electrically conductive contacts on the active region;
a plurality of first non-electrically conductive fibrils extending between the second surface of said IC and the mechanical contact regions and being fixed to the second surface of said IC and the mechanical contact regions, said plurality of first non-electrically conductive fibrils including adjacent rows extending in alternating fashion to opposite sides with respect to an axis transverse to the first and second surfaces; and
a plurality of second electrically conductive fibrils, extending between the second surface of said IC and the plurality of electrically conductive contacts and being fixed to the second surface of said IC and the plurality of electrically conductive contacts.

2. The electronic device according to claim 1, wherein said plurality of non-electrically conductive first fibrils comprises polymeric nanotubes.

3. The electronic device according to claim 1, wherein said plurality of non-electrically conductive first fibrils is coupled to the mechanical contact regions based upon at least one of covalent bonds, Van der Waals forces, and electrostatic forces.

4. The electronic device according to claim 1, wherein each first non-electrically conductive fibril has a diameter in a range of 1-5 nm and a length in a range of 1-5 µm.

5. The electronic device according to claim 1, wherein the semiconductor device comprises a heat sink.

6. The electronic device according to claim 1, wherein the plurality of second fibrils extends in a direction transverse to the first and second surfaces.

7. An electronic device comprising:
an integrated circuit (IC) having opposing first and second surfaces;
a semiconductor device having an active region and mechanical contact regions laterally spaced therefrom;
a plurality of electrically conductive contacts on the active region;
a plurality of first non-electrically conductive fibrils extending between the second surface of said IC and the mechanical contact regions and being fixed to the second surface of said IC and the mechanical contact regions, said plurality of first non-electrically conductive fibrils extending at an angle between 0° and 30° with respect to an axis transverse to the first and second surfaces, and including adjacent rows extending in alternating fashion to opposite sides with respect to the axis transverse to the first and second surfaces; and
a plurality of second electrically conductive fibrils, extending between the second surface of said IC and the plurality of electrically conductive contacts, and being fixed to the second surface of said IC and the plurality of electrically conductive contacts, the plurality of second fibrils extending in a direction transverse to the first and second surfaces.

8. The electronic device according to claim 7, wherein said plurality of first non-electrically conductive fibrils comprises polymeric nanotubes.

9. The electronic device according to claim 7, wherein said plurality of first non-electrically conductive fibrils is coupled to the mechanical contact regions based upon at least one of covalent bonds, Van der Waals forces, and electrostatic forces.

10. The electronic device according to claim 7, wherein each first non-electrically conductive fibril has a diameter in a range of 1-5 nm and a length in a range of 1-5 µm.

11. The electronic device according to claim 7, wherein the semiconductor device comprises a heat sink.

* * * * *

UNITED STATES PATENT AND TRADEMARK OFFICE
CERTIFICATE OF CORRECTION

PATENT NO. : 9,145,294 B2
APPLICATION NO. : 13/170908
DATED : September 29, 2015
INVENTOR(S) : Davide Giuseppe Patti and Alessandro Mascali It is certified that error appears in the above-identified patent and that said Letters Patent is hereby corrected as shown below:

Title page item (75), line 2,     Delete: "Syracuse (IT)"
                                                   Insert --Siracusa (IT)--

Signed and Sealed this
Twelfth Day of April, 2016

Michelle K. Lee
*Director of the United States Patent and Trademark Office*